US011592489B2

(12) United States Patent
Aubin et al.

(10) Patent No.: US 11,592,489 B2
(45) Date of Patent: Feb. 28, 2023

(54) BATTERY INTERFACE DEVICE

(71) Applicant: FAIVELEY TRANSPORT TOURS, Saint-Pierre-des-Corps (FR)

(72) Inventors: Philippe Aubin, Chanceaux sur Choisille (FR); Bruno Colas, Joue les Tours (FR)

(73) Assignee: FAIVELEY TRANSPORT TOURS, Saint Pierre-des (FR)

( * ) Notice: Subject to any disclaimer, the term of this patent is extended or adjusted under 35 U.S.C. 154(b) by 823 days.

(21) Appl. No.: 16/342,439

(22) PCT Filed: Oct. 16, 2017

(86) PCT No.: PCT/FR2017/052833
§ 371 (c)(1),
(2) Date: Apr. 16, 2019

(87) PCT Pub. No.: WO2018/073519
PCT Pub. Date: Apr. 26, 2018

(65) Prior Publication Data
US 2020/0057111 A1 Feb. 20, 2020

(30) Foreign Application Priority Data
Oct. 17, 2016 (FR) ...................................... 1660056

(51) Int. Cl.
*G01R 31/36* (2020.01)
*G01R 31/396* (2019.01)
(Continued)

(52) U.S. Cl.
CPC ....... *G01R 31/3648* (2013.01); *G01R 31/396* (2019.01); *H01M 10/482* (2013.01); *H02J 7/0014* (2013.01)

(58) Field of Classification Search
CPC ............. G01R 31/3648; G01R 31/396; H01M 10/482
(Continued)

(56) References Cited

U.S. PATENT DOCUMENTS 5,656,915 A * 8/1997 Eaves ................... H02J 7/0024
320/120
6,031,354 A * 2/2000 Wiley ................ G01R 31/3648
320/132
(Continued)

FOREIGN PATENT DOCUMENTS

DE 102007050821 A1 4/2009
EP 1006597 A2 6/2000
(Continued)

OTHER PUBLICATIONS

International Search Report, dated Feb. 2, 2018, from corresponding PCT application No. PCT/FR2017/052833.

*Primary Examiner* — Ricky Go
(74) *Attorney, Agent, or Firm* — The Small Patent Law Group LLC; Joseph M. Butscher

(57) ABSTRACT

A device for interfacing between a battery management system and groups of battery cells including at least one set of local units and at least one global unit that is connected to the local units of the at least one set. Each local unit is configured to compare a parameter related to a group of cells and associated with a first setpoint value, the first setpoint value originating from the at least one global unit, and to generate an output signal representative of the result of the comparison, and the at least one global unit is configured to receive the first setpoint value and includes an electronic module having an operating parameter having a global value that is dependent on the output signals generated by the local units of the at least one set.

20 Claims, 6 Drawing Sheets

(51) Int. Cl.
*H01M 10/48* (2006.01)
*H02J 7/00* (2006.01)

(58) Field of Classification Search
USPC .......................................................... 702/63
See application file for complete search history.

(56) References Cited

U.S. PATENT DOCUMENTS

| | | | |
|---|---|---|---|
| 6,472,098 | B1 | 10/2002 | Sawada et al. |
| 7,553,583 | B2 * | 6/2009 | Eaves ................... B60L 3/0046 |
| | | | 429/61 |
| 8,248,030 | B2 | 8/2012 | Doepke et al. |
| 9,203,248 | B2 | 12/2015 | Ohkawa et al. |
| 10,222,427 | B2 * | 3/2019 | Wenzel ................ H02J 7/0068 |
| 10,703,219 | B2 * | 7/2020 | Li ........................... B60L 53/60 |
| 2008/0233471 | A1 | 9/2008 | Aumayer et al. |
| 2009/0085681 | A1 | 4/2009 | Lin et al. |
| 2011/0140665 | A1 | 6/2011 | Tamezane et al. |
| 2011/0316483 | A1 | 12/2011 | Zhang |
| 2013/0065093 | A1 | 3/2013 | White et al. |
| 2014/0132218 | A1 | 5/2014 | Beranger et al. |
| 2016/0126892 | A1 | 5/2016 | Huang et al. |

FOREIGN PATENT DOCUMENTS

| | | |
|---|---|---|
| EP | 2273680 A1 | 1/2011 |
| EP | 1977263 B1 | 10/2011 |
| EP | 2485293 A1 | 8/2012 |
| JP | 2011-247760 A | 12/2011 |

\* cited by examiner

BATTERY INTERFACE DEVICE

The present invention concerns an interface device for interfacing between a battery management system and groups of cells of a battery module.

The invention also concerns a battery management system comprising such an interface device, and a battery module comprising such an interface device.

It also concerns a set formed of groups of battery cells, a battery management system and an interface device for interfacing between the groups of battery cells and the battery management system.

A battery module is formed by a set of electricity accumulators, battery cells or battery elements.

In general, in a battery module, several battery cells are connected together in parallel forming a block or group of cells. Several blocks of cells are connected together in series in order to form a column of cell blocks or column of cells. A battery module comprises several columns of cells connected together in parallel.

Electronic circuits are associated with the battery modules in order to ensure the proper operation of the battery modules. In particular, these electronic circuits monitor the value of the parameters relative to the battery cells.

For example, document EP 1 977 263 describes an electronic circuit checking that the voltage of a battery cell does not exceed a voltage threshold. An electronic circuit is thus associated with each battery cell of a battery module and compares the voltage of the cell to a threshold voltage. When a battery cell exceeds the threshold voltage, the charging process of the battery module is stopped.

In such a system, the threshold voltage is set by the electronic circuit and a single operation is provided on exceeding the voltage threshold by one of the cells, the system thus not being flexible.

There are more developed electronic circuits which ensure the proper operation of battery modules such as battery management systems, or BMSs.

Battery management systems are widely used today and are indispensable for battery modules using certain technologies, such as the Lithium-Ion technology.

Among other things, battery management systems monitor certain parameters relative to the battery cells or battery elements, such as the voltage or the temperature, ensuring they remain within a predetermined range of values.

Thus, the battery management systems monitor and control the operation of the battery cells for example by identifying cells in which a value of voltage and/or temperature may present a problem in the operation of the battery module.

Furthermore, on the basis of these voltage measurements, battery management systems seek to make the voltages of the cells uniform. For this they discharge the cells for which the voltage is too high relative to a threshold value, by for example connecting a discharging resistance in parallel with those cells. This method is generally known under the name of balancing.

A known battery management system architecture comprises local electronic blocks, a local electronic block being associated with one or more blocks of cells, and a general electronic block associated with each column of cells and being connected to the local electronic blocks associated with one or more blocks of cells in the column.

In a battery management system having such a structure, each local electronic block performs voltage and/or temperature measurements of the blocks of cells that are associated with it, the measured voltage and temperature values being sent to the general electronic block associated with the column of cells.

The general electronic block associated with a column of cells thus receives the values of voltage and/or of temperature measured for the blocks of cells of the column of cells and checks the operation of the blocks of cells on the basis of the values received.

Thus, for example, the general electronic block may identify that a block of cells exceeding a maximum or minimum temperature or voltage value, or command a balancing operation in a particular block of cells.

The battery management system may be used flexibly, that is to say for example, that the maximum and minimum temperature and voltage values may be modified and the management strategies for the cells using the values measured in the cells may be varied.

For battery modules in which the blocks of cells comprise very few cells (for example 1 to 3 cells) and which require redundancy in voltage measurements of each block of cells, the battery management systems are thus complex systems and use a high number of specialized integrated circuits.

Thus, the use of a high number of specialized integrated circuits is detrimental to the reliability of the system and leads to a high cost in the implementation of a battery module, in particular for battery modules with a high number of battery cells.

The present invention is directed to providing an interface device for interfacing between a battery management system and groups of battery cells of a battery module simplifying the management of the groups of cells while increasing the reliability of the management.

To that end, according to a first aspect, the invention concerns an interface device for interfacing between a battery management system and groups of battery cells and comprising at least one set of local units and at least one general unit connected to the local units of said at least one set and comprising means for connection to a battery management system, each local unit of said at least one set being configured to be associated with a group of battery cells.

According to the invention, each local unit comprises a first comparison module for comparing a parameter relative to a group of cells associated with a first setpoint value, the first setpoint value being provided by said at least one general unit, and for generating an output signal representing the result of said comparison, and said at least one general unit is configured to receive the first setpoint value and comprises an electronic module having an operating parameter presenting a general value which depends on the output signals provided by the local units of said at least one set, the general value representing the number of comparison results indicating that the value of the parameter relative to an associated group of cells is greater than the first setpoint value, or representing the number of comparison results indicating that the value of the parameter relative to an associated group of cells is less than the first setpoint value, the electronic module of the general unit comprising an oscillator circuit, the operating parameter being the period of oscillation of said oscillator circuit, each output signal being connected to said oscillator circuit by means of an output capacitor, such that said output capacitor is connected in parallel with an oscillator capacitor of said oscillator circuit or is disconnected according to said output signal.

Thus, the comparison of a parameter relative to a group of cells with a setpoint value is thus carried out locally in the local unit associated with the group of cells.

This simplifies the operations carried out in the general unit, while leaving the control of the interface device to the general unit.

The local units respectively generate signals representing the comparison results, the set of output signals causing to vary the general value of an operating parameter of an electronic module in the general unit. The general value of this operating parameter thus represents the results of the comparisons made by the local units, each output signal representing a positive or negative result, that is to say indicating that the value of a parameter relative to an associated group of cells is respectively greater than or less than the first setpoint value, or respectively less than or greater than the first setpoint value according to the direction of comparison employed.

In other words, the value of the operating parameter of the electronic module varies when the number of output signals representing positive results (and therefore the number representing negative results) varies.

As the operating parameter is the oscillation period of an oscillator circuit, the oscillation period (and the oscillation frequency) of the oscillator circuit varies according to the results of comparison implemented by the local units, the value of the period (and of the frequency) of oscillation representing the number of local units generating a positive result.

Each output signal provided by the local units is connected to the oscillator circuit by means of an output capacitor, the output capacitor being connected in parallel with an oscillator capacitor of the oscillator circuit or disconnected according to the output signal.

Thus, when a local unit generates an output signal representing a positive result, the output oscillator comes to be connected in parallel with the oscillator capacitor of the oscillator circuit, varying the oscillation frequency of the oscillator circuit.

Therefore, the number of local units generating a positive result may be deduced according to the value of the oscillation period or oscillation frequency of the oscillator circuit.

Therefore, thanks to the value of the operating parameter of the electronic module, the operating parameter being the oscillation period of the oscillator circuit, the existence is identified in a simple manner of at least one local unit generating an output signal indicating that the value of a parameter relative to an associated group of cells is greater than or less than a first setpoint value according to the direction of comparison employed.

Furthermore, the number of local units detecting the exceeding of the first setpoint value for an associated group of cells, or the number of local units detecting the lower magnitude of the first setpoint value for an associated group of cells, may be deduced by the general unit according to the general value of the operating parameter or oscillation period of the oscillator circuit.

Furthermore, the first setpoint value used by the local units is provided by the general unit, the general unit receiving that first setpoint value as input.

According to a feature, the general unit is configured to send said general value to a battery management system.

Thus, the general value of the operating parameter is communicated to the exterior of the interface device, in order for a module connected to the interface device, such as a battery management system to be informed of that general value and be able to make use of it.

For example, a management system can successively address different setpoint values, for example by performing scanning of the setpoint value. It is thus possible to obtain a histogram of the number of groups of cells according to the ranges of setpoint value. It is also possible to check that the output signal of a local unit does not remain fixed in one state, which is a sign of a fault in the interface device.

According to a feature, the interface device comprises a test unit configured to compare a setpoint signal representing a first setpoint value with a reference value.

By virtue of the test unit, it is possible to check the first setpoint value, for example by varying it around the reference value. Thus, the test phases of the interface device are implemented in simplified manner, the test of the interface device being thus further improved.

According to embodiments, an output capacitor is placed in each local unit, or output capacitors are placed in the general unit.

According to a feature, each local unit further comprises a second comparison module for comparing a parameter relative to a group of battery cells with a second setpoint value, said second setpoint value being provided by said at least one general unit, and, according to the result of said comparison, for generating a local command acting on said local unit.

Thus, this local command may be used advantageously for the balancing of the voltage of groups of battery cells. It is triggered by the associated unit, by means of a simple comparison, the moment at which the balancing is triggered being fixed by the exceeding of the second setpoint value, this second setpoint value being set by the unit.

According to a feature, said local command comprises a second output signal representing the result of said comparison, an output resistance being connected or not connected to the output of said local unit according to said second output signal.

Thus, this resistance may be used as a discharging means for the associated group of cells in the context of the balancing of cell group voltage.

According to a feature, the interface device is furthermore configured to generate said first output signal according to the result of the comparison of said parameter relative to a group of battery cells with said second setpoint value generated by said second comparison module.

Thus, the comparison of the parameter relative to a group of battery cells with the second setpoint value constitutes redundancy relative to the comparison of the parameter with the first setpoint value. The proper operation of the interface device and in particular of the local units is thus checked.

Therefore, the operations of testing the interface device are further improved.

Furthermore, the second setpoint value is used in balancing operations and in testing operations.

Therefore, the value of the second setpoint may be used advantageously as a balancing command and temporarily as verification of the results arising from the comparisons of the parameter with values of the first setpoint.

According to a feature, said parameter relative to a group of battery cells is a voltage or a temperature and the setpoint value is a value of voltage or of temperature.

According to a feature, each local unit is furthermore configured to compare at least one additional parameter relative to a group of cells with at least one first additional setpoint value.

According to a feature, each local unit comprises a first comparison module comprising comparison means, the first comparison module having a first input receiving said parameter relative to a group of battery cells and a second input receiving a signal representing said first setpoint value and generating as output said output signal, and switching means connecting or not connecting the output of said local unit to said at least one general unit, said switching means being controlled by said output signal.

According to a feature, said at least one general unit comprises means for generating said signal representing said first setpoint value, said signal being a square-wave signal of amplitude representing said first setpoint value, each local unit being connected to said signal by means of a capacitor.

The connection by capacitors between the local units and the general unit makes it possible to implement local and general units at different references of potential. Thus, the electrical voltage withstanding capability of the local units may be limited to the maximum voltage of the associated group of cells and that of the general unit may be less than the voltage of the battery module formed by the groups of cells associated with the local units.

According to a feature, each local unit further comprises a second comparison module comprising comparison means, the second comparison module having a first input receiving said parameter relative to a group of battery cells and a second input receiving a signal representing said value of the second setpoint and generating as output said output signal, and switching means connecting or not connecting said output resistance to the output of said local unit, said switching means being controlled by said output signal.

According to a feature, said at least one general unit further comprises means for generating said setpoint signal representing said value of the second setpoint, said signal being a square-wave signal of amplitude representing said value of the second setpoint, each local unit being connected to said signal by means of a coupling capacitor.

According to a second aspect, the invention is directed to a battery management system comprising an interface device in accordance with the invention.

According to a third aspect, the invention is directed to a battery module comprising at least one column of cells comprising several groups of battery cells connected together in series, each group of battery cells comprising several battery cells connected together in parallel, said battery module comprising an interface device in accordance with the invention.

According to a fourth aspect, the invention is directed to a set comprising groups of battery cells and a battery management system, the groups of battery cells forming at least one column of cells, the groups of battery cells being connected together in series, each group of battery cells comprising several battery cells connected together in parallel, the set comprising an interface device in accordance with the invention disposed between the battery management systems and the groups of battery cells.

The battery management system, the battery module and the set comprising groups of battery cells, a battery management system and an interface device having features and advantages similar to those described previously in relation with the interface device.

Still other particularities and advantages of the invention will appear in the following description.

In the accompanying drawings, given by way of non-limiting example:

FIG. 1 diagrammatically represents a battery module architecture;

FIG. 2 diagrammatically illustrates a set formed by the battery module of FIG. 1, a battery management system and an interface device according to an embodiment;

Figure 1:
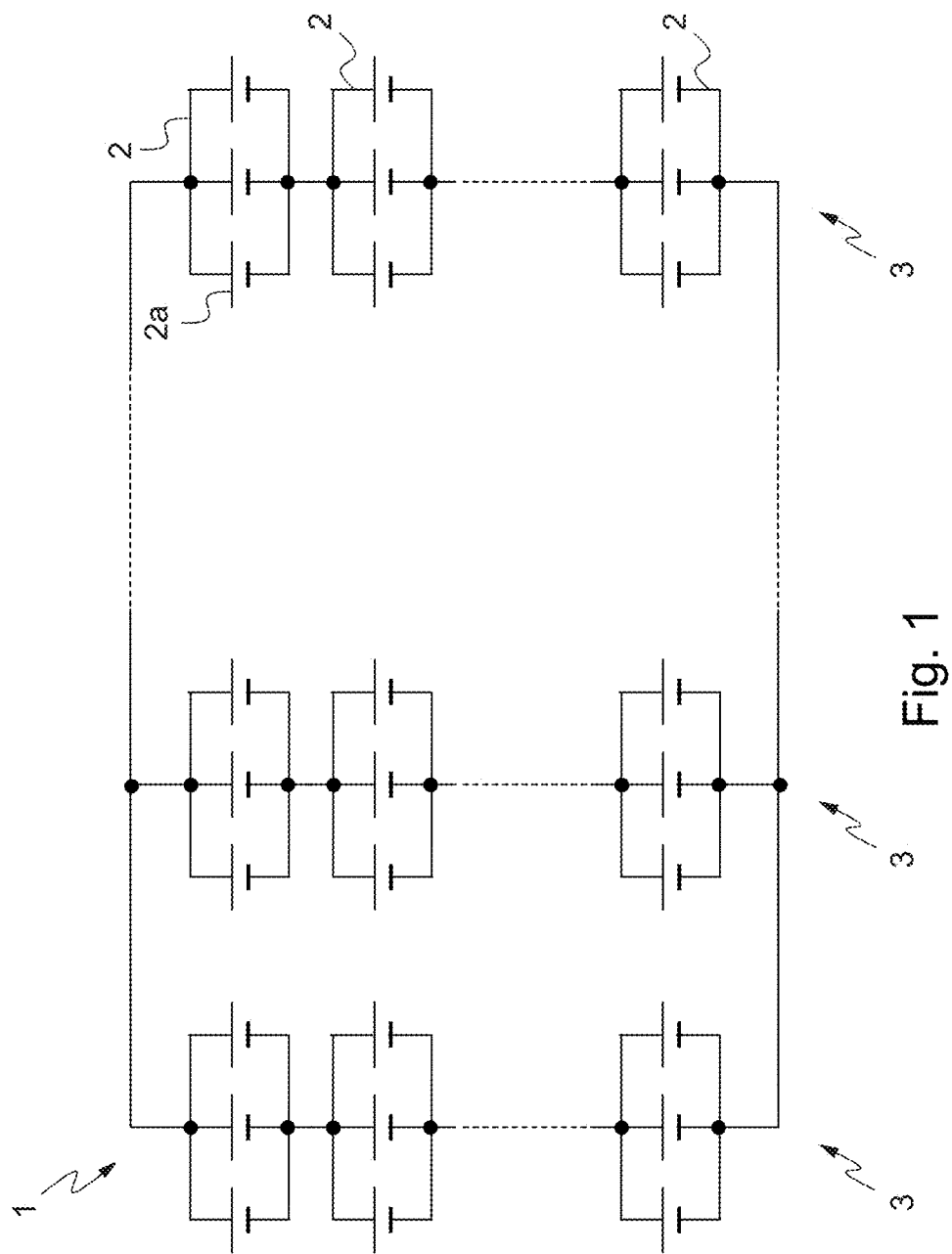
FIG. 1 represents a battery module for which the invention applies.

In the architecture represented, the battery module 1 comprises groups of cells 2 connected together in series, so as to form a column of groups of cells or a column of cells 3. Each group of battery cells 2 comprises several battery cells 2a connected together in parallel.

The battery module 1 represented comprises several columns of cells 3 connected together in parallel.

In an embodiment, each group of cells 2 comprises three battery cells 2a connected together in parallel. Of course, the number of battery cells per group of cells 2 could be different from three, and could even comprise a single battery cell.

In the represented embodiment, three groups of batteries 2 are represented per column and three columns 3 are represented in the battery module 1.

Of course, the number of groups of cells 2 per column of cells 3 and the number of columns 3 per battery module 1 is variable.

Different types of battery may be used in the battery modules according to the described architecture, for example batteries of Lithium-ion type. The use of this type of battery cell makes it possible to implement battery modules having a reduced volume and weight for a capacity equivalent to a battery module using other types of batteries.

These types of battery modules may have various applications and may apply particularly to transport vehicles such as rail transport vehicles, for example such as trains, metros, tramways, trolley-buses, etc.

Figure 2:
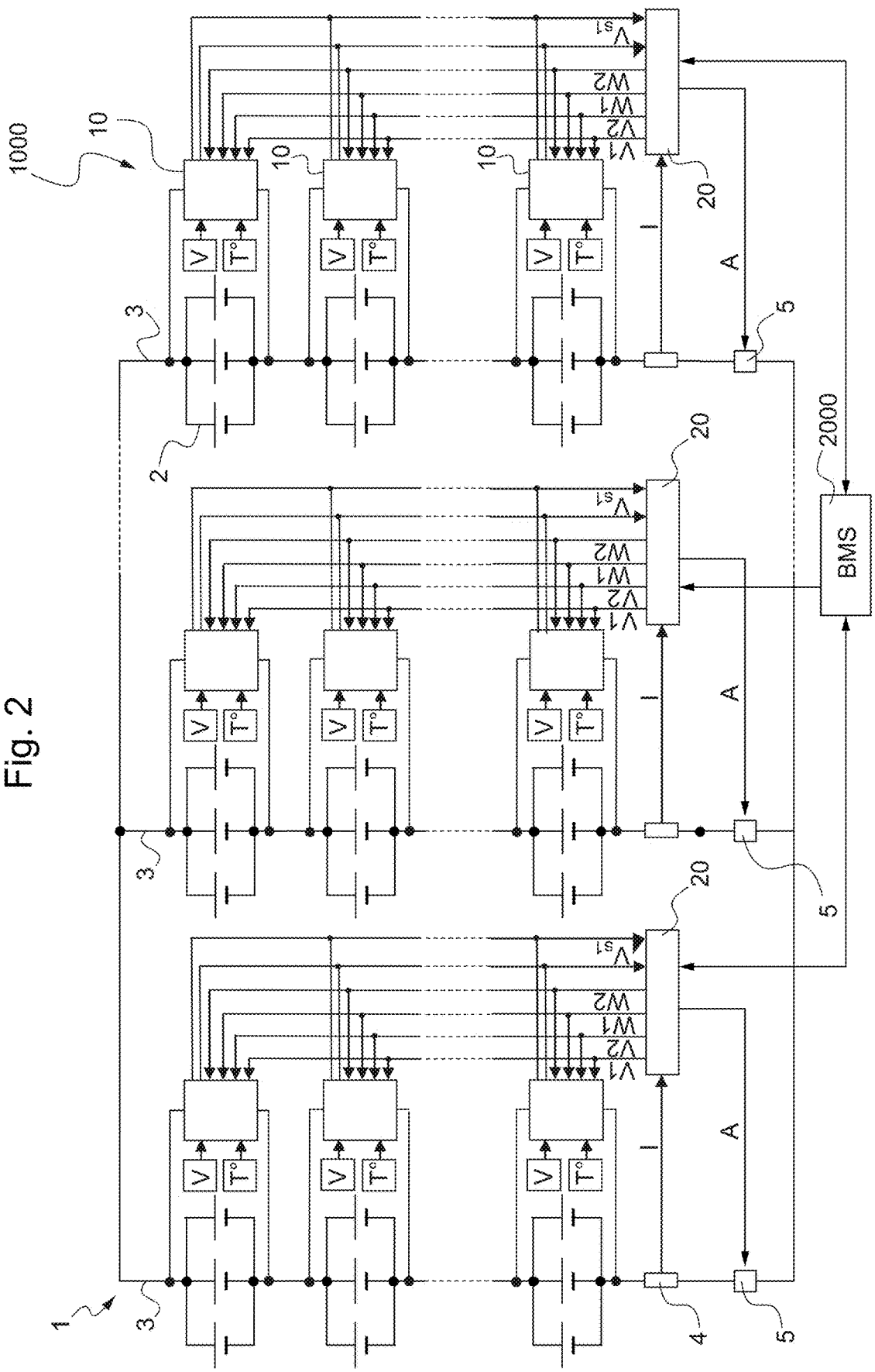

In FIG. 2, an interface device 1000 between a battery management system 2000 and the battery module described with reference to FIG. 1 is illustrated.

The interface device 1000 comprises several sets of local units 10 and several general units 20. A set of local units 10 is formed in this embodiment by the local units 10 associated with groups of battery cells 2 connected in series, that is to say forming part of a same column of batteries 3. In this embodiment, the local units 10 of a set of local units are connected to a general unit 20.

Thus, a set of local units may be defined as several local units 10 connected to a same general unit 20.

The general unit 20 comprises means for connection (not shown in the figure) to a battery management system 2000.

It will thus be noted that the interface device 1000 implements an interface between the battery module 1 and a battery management system 2000.

In FIG. 2, three general units 20 are represented, each general unit 20 being connected to several local units 10 forming a set of local units.

In the Figure, only three sets of local units connected to three general units respectively are illustrated.

It will be noted that in the illustrated embodiment, each set of local units and the general unit to which the set of local units 10 is connected are associated with a column of cells 3.

According to other embodiments, several sets of local units and an associated general unit may be associated with groups of battery cells forming part of a same column of batteries.

According to other embodiments, a single general unit may be connected to the local units associated with groups of battery cells forming part of the columns of the different cells.

A local unit 10 is configured to compare a parameter relative to an associated group of cells 2 with a setpoint value. The means for implementing this comparison are described later with reference to FIGS. 3 and 5.

The setpoint value used by the local units 10 is provided by the general unit 20 to which the local unit 10 is connected.

Each local unit 10 is furthermore configured to generate an output signal Vs1 representing the result of the comparison. The output signal Vs1 is addressed to the general unit 20.

The general unit 20 is configured to receive the setpoint value. For example, the setpoint value is provided by a battery management system 2000.

The general unit 20 comprises an electronic module (24, illustrated in FIGS. 4 and 6) having an operating parameter presenting a general value which depends on the output signals Vs1 provided by the local units 10 of the set of local units associated with the general unit 20.

The output signal Vs1 representing the result of the comparison may thus either indicate that the value of the parameter relative to an associated group of cells is greater than the setpoint value, or that the value of the parameter is less than the setpoint value.

The general value of the operating parameter of the electronic module represents the number of comparison results indicating that the value of the parameter is greater than the setpoint value or represents the number of comparison results indicating that the value of the parameter is less than the setpoint value.

As will be described later, the output signals Vs1 provided by the local units 10 act on the general value of the operating parameter of the electronic module.

In other words, the electronic module of the general unit 20 receives the output signals Vs1 from the local units 10, the general value of the operating parameter being modified by the output signals Vs1 provided by the local units 10.

The general unit 20 is configured furthermore to send the general value of the operating parameter from the electronic module of the general unit 20 to a battery management system 2000.

When the interface device 1000 is installed between a battery module 1 and a battery management system 2000, the battery management system 2000 generates the setpoint value and addresses it to the general unit 20, the general unit 20 in turn addressing it to the local units 10 of the set of associated local units 10.

The battery management system 2000 may also receive from the interface device 1000 the general value of the operating parameter of the electronic module of the general unit 20.

By virtue of this general value, the battery management system 2000 is able to compute the number of positive results of the comparisons and the number of negative results. The battery management system may thus, according to the general value, deduce whether there are groups of battery cells exceeding the setpoint value for a parameter, for example such as the voltage or the temperature, relative to a group of battery cells.

Furthermore, the battery management system 2000 may for example modify the setpoint value, and for example perform scanning of setpoint values and obtain general values associated with each setpoint value. With these general values respectively obtained for the setpoint values, the battery management system 2000 is able for example to obtain a histogram representing the number of cells exceeding or that are less than setpoint values.

The battery management system may furthermore check that the output signal Vs1 of a local unit 10 does not remain fixed in one state, which is a sign of a fault in the interface device. For example, it may be checked that when the setpoint value varies between its minimum value and maximum value, the general values representing the number of comparison results comprise at least one value representing a null number of comparison results and that which represents a maximum possible number of comparison results. Therefore, the proper operation of the interface device 1000 may be ensured.

Figure 3:
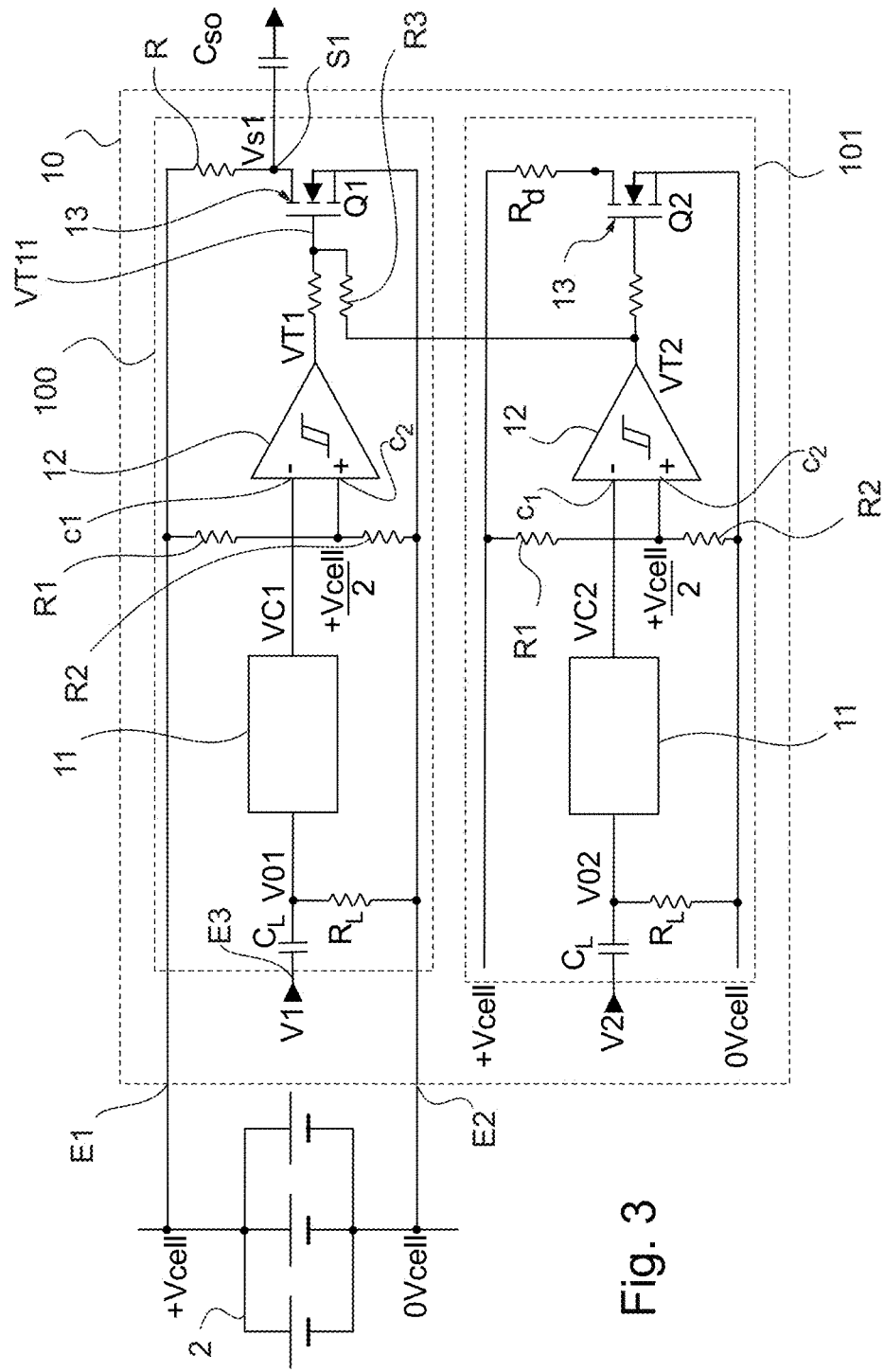
FIG. 3 illustrates diagrams for electronic circuits in a local unit in accordance with an embodiment.

FIG. 3 represents a group of battery cells 2 with an associated local unit 10.

The local unit 10 comprises a first input E1 and a second input E2 which are respectively connected to the terminals of the group of battery cells 2.

Thus, the local unit 10 receives via the first input E1 and the second input E2 the voltage Vcell at the terminals of the group of battery cells 2.

The local unit 10 comprises a third input E3 by means of which it receives a signal V1 representing the setpoint value provided by the general unit 20.

A first capacitor, named coupling capacitor $C_L$ is connected between the third input E3 and a peak detector module 11. The output VC1 of the peak detector 11 is connected to a first input c1 of a comparator 12. A coupling resistor $R_L$ is connected between the input of the peak detector 11 and the second input E2 of the local unit 10, this second input E2 of the local unit 10 receiving a reference voltage, which is zero volt here (0Vcell in the Figure).

Two resistors R1, R2 are connected together in series and, between the first input E1 and the second input E2 of the local unit 10 forming a voltage divider.

The voltage taken between the two resistors R1, R2 is connected to a second input c2 of the comparator 12.

In the described embodiment, the values of the resistors R1, R2 of the voltage divider are identical, the voltage taken between the resistors thus being equal to half the voltage Vcell at the terminals of the group of battery cells 2 (Vcell/2).

In the described embodiment, the comparator 12 is a comparator with hysteresis.

The comparator 12 generates as output an output signal VT1 representing the result of the comparison between the signals input to these input terminals c1, c2.

Switching means 13 are connected to the output of the comparator 12. Thus, the switching means 13 are controlled by the output signal VT1 of the comparator 12. According to the output signal VT1 from the comparator 12, the switching means 13 are activated or deactivated making it possible to modify the output signal Vs1 from the local unit 10, this output signal Vs1 being taken at the output S1 of the local unit 10.

The switching means 13 furthermore make it possible to connect, to the output S1 of the local unit 10, the output signal VT1 from the comparator 12.

Thus, according to the state of operation of the switching means 13, the output signal Vs1 is different, the output signal Vs1 representing the result of the comparison performed by the comparator 12.

In one embodiment, the switching means are a field effect transistor Q1 or MOSFET (standing for "Metal Oxide Semiconductor Field Effect Transistor").

In the embodiment described the field effect transistor Q1 is of N-type.

An output capacitor Cso is connected to the output S1 of the local unit 10 by a first terminal, its second terminal being connected to the general unit 20.

In other embodiments, the output capacitance Cso is included in the general unit 20.

Furthermore, the comparison means 12 as well as the switching means 13 could be of types other than those described with reference to FIG. 3.

Furthermore, different types of transistor may be used, that are of course suitable for operating with the comparator which could be of a type different from a comparator with hysteresis.

A resistor R is connected between the drain of the transistor Q1 and the positive terminal Vcell of the group of battery cells 3. Its role will be described later.

The electronic circuit described above forms a first comparison module 100, and its operation will be described below.

The local unit 10 further comprises a second comparison module 101 similar to the first comparison module 100. As the structure of the second comparison module is similar to the structure of the first comparison module, it is not described again.

It will be noted in this document that although identical components are repeated in different modules, they bear the same numerical references.

The second comparison module 101 receives as input the voltage at the terminals of the group of battery cells 2 as well as a second setpoint signal V2 provided by the general unit 20.

The local unit 10 further comprises a link resistor R3 linking the output of the comparator 12 of the comparison module 101 to the gate of the field effect transistor Q1 of the first comparison module 100.

Thus, as will be described later, the operating mode of the transistor Q1 also depends on the output from the comparator 12 of the second comparison module 101.

Figure 4:
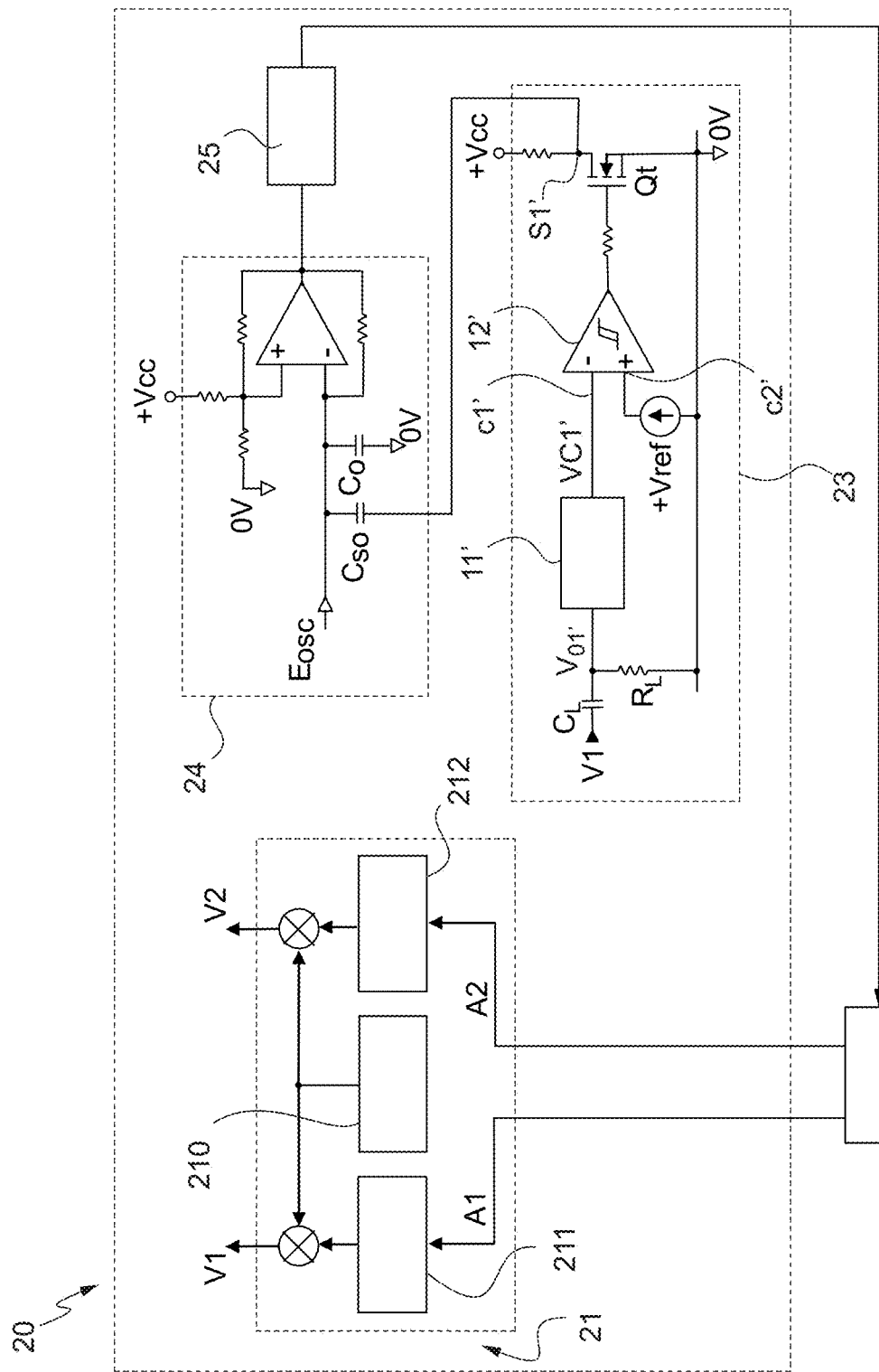
FIG. 4 illustrates diagrams for electronic circuits in a general unit according to an embodiment.

FIG. 4 represents electronic circuits present in the general unit 20.

The general unit 20 generates as output a first setpoint signal V1 representing the first setpoint value and a second setpoint signal V2 representing the second setpoint value.

The general unit 20 comprises generation means 21 for the setpoint signals V1, V2 respectively representing the setpoint values.

In the described embodiment, the generation means 21 comprise a square-wave signal generation module 210 and two amplitude value generation modules 211, 212.

The square-wave signal generation module 210 cooperates with the amplitude value generation modules 211, 212 in order to generate setpoint signals V1, V2.

In this embodiment, the setpoint signals V1, V2 are square-wave signals of which the amplitudes represent setpoint values respectively representing setpoint values.

Thus, the generation means 21 generate a first signal V1 representing a first setpoint value A1 and a second signal V2 representing a second setpoint value A2.

The general unit 20 comprises connection means (not visible in the figures) to a battery management system 2000. The setpoint values A1, A2 are received from the battery management system 2000.

The general unit 20 further comprises a comparison module 23 similar to the first and second comparison modules 100, 101 of the local unit 10.

In this comparison module 23, the second input c2' of the comparator 12' is a reference value instead of being a division of the voltage at the terminals of the group of battery cells.

As will be described later, the comparison module 23 is configured to check the setpoint signal V1 generated by the generation means 21. This comparison module 23 is thus configured for the test operations of the interface device 1000.

The general unit 20 further comprises an electronic module 24 which, in the described embodiment, is an oscillator circuit.

The oscillator circuit 24 comprises an oscillator capacitor $C_O$ connected between the input $E_{OSC}$ of the oscillator circuit 24 and its voltage reference, which here is 0v.

An output S1' from the comparison module 23 is connected to the input Eosc of the oscillator circuit 24, an output capacitor Cos connecting the comparison module 23 and the oscillator circuit 24.

The general unit 20 further comprises a measuring module 25, configured to measure the period and the frequency of the oscillator circuit 24, as will be described later.

The measuring module 25 is furthermore configured to determine the number of groups of battery cells of which the voltage is greater than or less than a setpoint value based on that period or that frequency.

The measuring module 25 is configured to address the determined number of battery cells to the battery management system 2000.

As will be described above, according to the output signal of the comparator 12 of the first comparison module 101 of the local unit 10, an output capacitor Cso is connected in parallel with the oscillator capacitor $C_O$.

It will be noted that the oscillation frequency of the oscillator circuit 24 is modified when the output capacitor Cso is connected in parallel with the oscillator capacitor $C_O$.

The circuits described above with reference to FIGS. 3 and 4 are provided to monitor the voltage at the terminals of the groups of cells, each group of cells being associated with a local unit 10 in order to detect situations in which at least one group of cells exceeds or is less than a certain value (setpoint value), this value being established by the general unit 20.

As indicated above, in the general unit 20, the generation means 21 generate a square-wave setpoint signal V1, the amplitude A1 of this square-wave signal being set by an amplitude control module 211. The amplitude A1 is received from the battery management system 2000 by the general unit 20.

The square-wave setpoint signal V1 has an amplitude A1 representing a first setpoint value.

The square-wave V1 is connected to the third input E3 of each local unit 10 of the set of local units. This square-wave setpoint signal V1 has a peak amplitude corresponding to the first setpoint value V1.

The coupling circuit formed by the coupling capacitor $C_L$ by the coupling resistor $R_L$ transforms the square-wave setpoint signal V1 into an output square-wave signal so as to center it relative to the reference value 0Vcell of the group of battery cells. Thus, a modified setpoint signal V01 is generated relative to the reference voltage value of the group of battery cells.

In this embodiment, the peak detector module 11 is a positive peak detector module generating as output VC1 a voltage equivalent to the amplitude A1 representing the first setpoint value. The voltage value VC1 is supplied to the first input c1 of the comparator 12.

The comparator with hysteresis 12 generates as output a binary signal VT1, the state of the signal VT1 depending on the comparison made by the comparator 12.

If the voltage value Vcell at the terminals of the group of battery cells 2 is greater than twice the amplitude value A1, the output of the comparator VT1 is in the high state and the field effect transistor Q1 is saturated.

By contrast, when the voltage value Vcell at the terminals of the group of battery cells 2 is less than twice the amplitude value A1, the output of the comparator VT1 is in the low state and the field effect transistor Q1 is off.

When the transistor Q1 of a local unit 10 is saturated, the output capacitor $C_{SO}$, located in this embodiment at the output of the local unit 10, is connected in parallel with the oscillation capacitance $C_O$ disposed at the input $E_{OSC}$ of the oscillator circuit 24 of the general unit 20.

Thus, when a local unit 10 generates an output signal Vs1 such that the transistor Q1 is saturated, the output capacitor $C_{SO}$ is connected in parallel to the oscillation capacitance $C_O$, and the operating period of the oscillator circuit 24 is proportional to the capacitance value of the oscillation capacitor $C_O$ and may be calculated by the formula Tosc=K·$(C_O+C_{SO})$, K being a constant, and Co being the capacitance of the oscillation capacitor, and Cso the capacitance of the output capacitor Cso of the local unit 10.

In this embodiment, the capacitances of the output capacitor and of the oscillation capacitor are identical.

The calculation of the operating period Tosc is carried out by the measuring module 25.

Thus, when the transistors Q1 of a number N of local units 10 are saturated, N output capacitors Cso are connected in parallel to the oscillation capacitor $C_O$ of the oscillator circuit 24.

Thus, the oscillation period Tosc may be calculated by the formula Tosc=K·(N+1)·Co. If the transistor Q1 is off, the output capacitor of the local unit 10 is not connected in parallel with the oscillation capacitance Co of the oscillator circuit 24 of the general unit 20, the oscillation period Tosc of the oscillator circuit 24 not being modified and being calculated by the formula Tosc=K·Co.

In this embodiment, the measuring module 25 is configured to deduce, based on the determined value of oscillation period Tosc, the number N of groups of cells of which the voltage is greater than twice the amplitude A1 using the formula:

$$N = \frac{T}{K \cdot Co} - 1$$

The generation means 21 of the general unit 20 further comprise a second amplitude generation module 212 provided to cooperate with the square-wave signal generator 210 in order to generate a second square-wave setpoint signal V2 of amplitude A2 representing the second setpoint value.

The square-wave setpoint signal V2 of amplitude A2 is supplied to the second comparison module 101 of each local unit 10 (FIG. 3).

The square-wave setpoint signal V2 has a peak amplitude corresponding to the second setpoint value A2.

As in the case of the first comparison module 100, the coupling capacitor $C_L$ and the coupling resistor $R_L$ bring the amplitude value A2 to a value taking as reference value that of the group of battery cells 2 (0Vcell). The coupling circuit generates a signal V02 supplied as input to the peak detector 11 which in turn generates a voltage VC2 which is supplied to a first input c1 of the comparator 12.

The operation of the second comparison module 101 is similar to the operation of the first comparison module 100.

Thus, the comparator 12 implements the comparison between the voltage VC2 generated according to the square-wave signal V2 of amplitude representing the second setpoint value A2 with half the voltage between the terminals of the group of battery cells (Vcell/2).

Thus, when the voltage at the terminals of the group of cells 2 is greater than twice the amplitude A2 of the signal V02, the field effect transistor Q2 at the output from the comparator 12 is saturated, linking a load resistor Rd in parallel with the group of cells.

It will be noted that the value of the resistor R at the output from the first comparison module 100 is generally different from the value of the load resistor Rd of the second comparison module 101. Thus, when a balancing operation is implemented and the load resistor Rd is connected to the group of battery cells 2, the value of the load resistor Rd is configured to discharge the group of battery cells 2 while the value of the resistor R is configured for the operation of the oscillator circuit 24.

In the described embodiment, the amplitude A2 representing a second setpoint value is equal to half a maximum voltage Vmax on the basis of which a balancing operation must be implemented on the group of battery cells 2 (Vmax/2=A2).

Thus, for all the groups of cells 2 having a voltage at its terminals greater than twice the value of the amplitude A2, that is to say greater than the maximum voltage Vmax, the field effect transistors Q2 are saturated, the load resistor Rd being connected in parallel to the group of battery cells 2.

In other words, when the group of battery cells 2 exceeds the maximum voltage Vmax, an operation of balancing is implemented on the group of battery cells 2.

Each local unit 10 is furthermore configured to compare a parameter relative to a group of battery cells 2, such as the voltage at the terminals of the group of battery cells, to a second setpoint value, such as the maximum value Vmax, and, according to the result of the comparison made by the comparison means 12, to generate a local command acting on the local unit 10.

In the described embodiment, the local command is a balancing command comprising a second output signal VT2 representing the result of said comparison, the load resistor Rd being connected or not connected to the output of the local unit according to the second output signal VT2.

In the described embodiment, the second output signal representing the result of the comparison VT2, output from the comparator 12 of the second comparison module 101, is a binary signal able to present a high level or a low level.

In the described embodiment, the second output signal VT2 has a high level when the voltage Vcell at the terminals of the group of battery cells 2 is greater than the maximum voltage Vmax, and has a low level when the voltage Vcell at the terminals of the group of battery cells 2 is less than the maximum voltage Vmax.

By virtue of the structure of the interface device 1000, a balancing operation is implemented on all the groups of battery cells 2 for which their voltage is greater than a maximum value Vmax (this maximum value Vmax being provided by the general unit 20), without however having to know either the voltage of the different groups of battery cells 2, nor having to identify the groups of battery cells exceeding a maximum voltage and therefore requiring that balancing operation.

The local unit 10 is furthermore configured to generate the output signal Vs1 according to the result of the comparison of the parameter relative to a group of battery cells such as the voltage at the terminals of the group of battery cells 2, with the second setpoint value A2.

Thus, the control signal VT11 of the transistor Q1 is generated by the second comparison module 101 instead of being generated by the first comparison module 100.

For this operation, the generation means 21 of the general unit 20 generates the square-wave setpoint signal V2 with an amplitude A2 representing the first setpoint value, the setpoint signal V2 being supplied to the second comparison module 101.

The oscillation period Tosc is measured by the measuring module 25 in the general unit 20, the number of groups of cells exceeding the first setpoint value being determined according to the oscillation period Tosc.

The battery management system 2000 receiving this number of groups of cells, may thus by comparison of this obtained number, with the number obtained when the first comparison module 100 is used for this same operation, check that the first comparison modules 100 are operating correctly.

It is thus avoided that a battery module 1 is put at risk by improper functioning of a comparison module 100 due for example to a failure of an electronic component.

The operation implemented by the second comparison module 101 described above constitutes redundancy in the measurement of the voltage carried out by the first comparison module 100. Thus, the second comparison module 101 is used to implement the balancing operations and redundant measurements.

The generation of the second square-wave signal V2 of amplitude A2 representing a first setpoint value by the general unit 20 is implemented periodically so as to perform regular test operations of the functioning of the first comparison module 100.

It will be noted that when the second comparison module 101 is used as a redundant circuit to measure the voltage Vcell at the terminals of the group of battery cells, the general unit 20, in particular the generation means 21, generate the first square-wave setpoint signal V1 at a high value such that the comparator 12 of the first comparison module 100 does not generate an output signal VT1 at high level.

Thus, the transistor Q1 is off, leaving the second comparison module 101 the possibility of placing it in saturation mode. In a similar way, in normal operation of the local units 10, that is to say when the voltage is measured by the first comparison module 100, the second square-wave setpoint signal V2 is generated at a high value such that the comparator 12 of the second comparison module 101 does not saturate the transistor Q1.

It will be noted that the comparison of a number of cells exceeding a voltage value, or not exceeding a voltage value, obtained using the first comparison module 100 and the first square-wave setpoint signal V1, with the number obtained using the second comparison module 101 and the second square-wave setpoint signal V2, makes it possible to detect anomalies in one of the comparison modules 100, 101.

The comparison module 23 of the general unit 20 represents a test unit configured to compare a voltage value VC1' at the input of the comparator 12' with a reference value Vref supplied to the second input c2' of the comparator 12'. The voltage value VC1' supplied to the first input c1' of the comparator 12' is generated by the peak detector 11' from a signal V01' input to the peak detector 11'. This signal V01' is generated from the first square-wave setpoint signal V1 generated by the generation means 21. As for the comparison modules 100, 101 described with reference to FIG. 3, a coupling capacitor $C_L$ and an input resistor $R_L$ transform the square-wave setpoint signal V1 relative to a local reference value, which here is 0 volt.

In the test operations, the value V1 of the amplitude A1 of the setpoint signal is modified relative to the version Vref so as to verify that the comparator 12' generates an output signal at different states.

When the signal output from the comparator 12' is at a high level, the transistor Qt is saturated, and an additional capacitor $C_{Os}$ is connected in parallel with the oscillator capacitor Co of the oscillator circuit 24.

The measuring module 25 measures an oscillation period Tosc which depends on the result of the comparator 12' and the number of groups exceeding the first setpoint value A1.

Thus, the proper operation of the interface device 1000 is ensured simply and without addition of complementary means.

Figure 5:
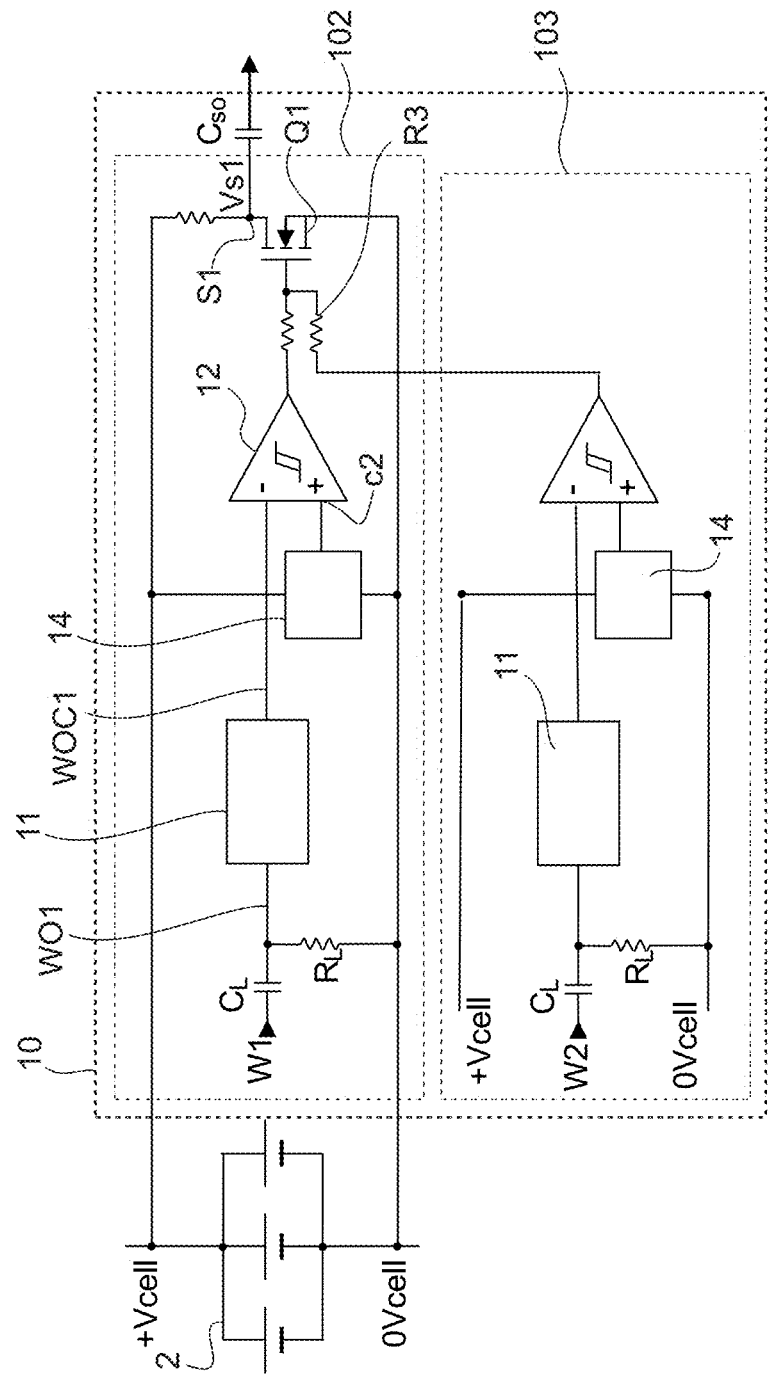
FIG. 5 represents electronic circuits in a local unit according to an embodiment.

FIG. 5 represents electronic circuits in a local unit 10 provided for the measurement of the temperature of a group of battery cells 2. Thus, the parameter relative to a group of battery cells is the temperature of the group of battery cells 2.

A local unit 10 according to the embodiment described comprises a first temperature comparison module 102 and a second temperature comparison module 103, these temperature comparison modules 102, 103 being similar respectively to the voltage comparison modules 100, 101. Thus, only the components that differ will be described here.

Each temperature comparison module 102, 103 comprises a temperature probe 14 disposed near the group of battery cells 2 which measures the temperature of the group of battery cells 2. The voltage representing the temperature measured by the temperature probe 14 is supplied to the second input c2 of the comparator 12. A signal WOC1 is supplied to the first input c1 of the comparator 12, this signal WOC1 being generated by a peak detector module 11 which receives as input a square-wave setpoint signal W1 generated by the general unit 20, in particular by a square-wave signal generator 210 (see FIG. 6).

In the described embodiment, the square-wave signal generator module 210, relative to the temperature, is different from the square-wave signal generator module 210 relative to the voltage.

Of course, a single square-wave signal could be used, in other embodiments.

The second temperature comparison module 103 constitutes a test unit for performing redundant measurements in similar manner to those described for the redundant measurements of the voltage at the terminals of the group of battery cells made by the second comparison module 101. In the case of temperature, the output of the comparator 12 of the second temperature comparison module 103 is connected by means of a resistor R3 to the gate of the transistor Q1 thus being able to control the transistor Q1 such that it is in saturated mode or off mode.

Figure 6:
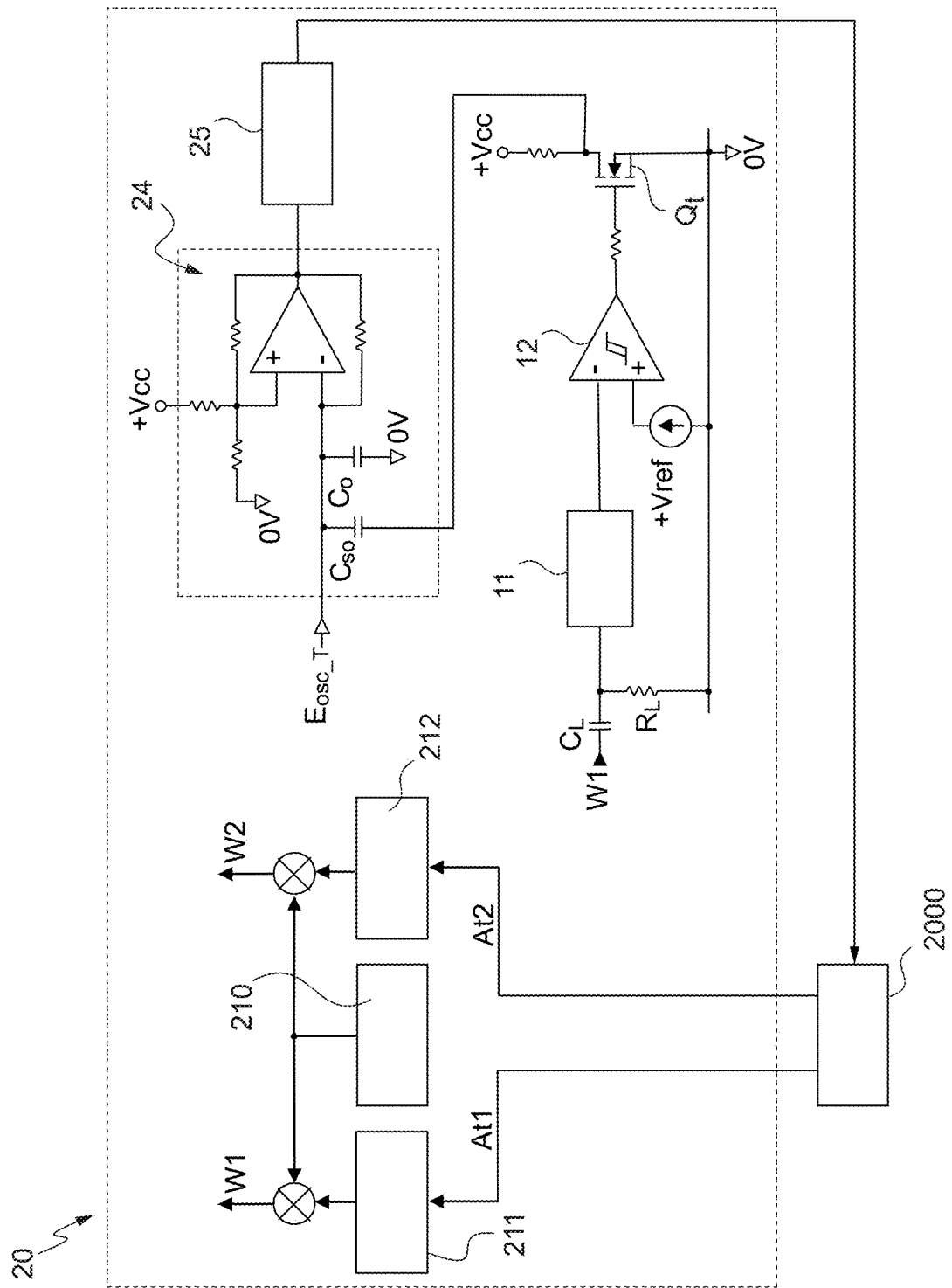
FIG. 6 illustrates diagrams for electronic circuits in a general unit according to an embodiment.

FIG. 6 represents electronic circuits of the general unit 20 represented concerning the measurement of temperature. The structure of these electronic circuits is identical to those represented in FIG. 4.

The general unit 20 comprises a third amplitude generation module 211 cooperating with the square-wave signal generator 210 to generate the third square-wave setpoint signal W1.

The general unit 20 further comprises a fourth amplitude module 212 cooperating with the square-wave signal generator 210 in order to generate a fourth square-wave setpoint signal W2.

The third and fourth amplitude generation modules 211, 212 are similar to the first and second generation modules, but are distinct entities in this embodiment.

The third square-wave setpoint signal W1 and fourth square-wave setpoint signal W2 are addressed to the local units of the set of local units 10 associated with the general unit 20.

The general unit 20 further comprises an additional comparison module similar to the comparison module 23 concerning the voltage measurement. The additional comparison module is provided to verify the setpoint signal W1, representing the temperature value, generated by the generation means 21.

As the operation of the set of electronic circuits concerning the temperature (FIGS. 4 and 6) is similar to the operation of the set of circuits concerning the voltage it will not be described again.

In the described embodiment, each local unit 10 measures the voltage and the temperature of the groups of battery cells 2.

Thus, each local unit 10 comprises comparison means for comparing a parameter (for example the voltage) relative to a group of cells with a setpoint value, and comparison means for comparing an additional parameter (for example the temperature) relative to a group of cells with an additional setpoint value.

In this embodiment, the parameter relative to a group of cells is the voltage Vcell at the terminals of the group of battery cells 2, and the additional parameter corresponds to the temperature of the group of battery cells 2.

In other embodiments, the local unit can comprise either comparison means for comparing the voltage with a setpoint voltage value, or comparison means for comparing a temperature to a setpoint temperature value.

In the described embodiment, all the local units 10 of the interface device 1000 are identical.

In other embodiments, the local units in a set of local units are identical to each other, the local units of different sets being different.

According to still another embodiment, local units of a set of local units can be different. For example, a first group of local units comprises electronic cells for the measurement of the voltage and of the temperature and a second group of local units comprises only the electronic circuits for the measurement of the voltage.

According to another example, a first group of local units comprises test circuits and a second group of local units does not comprise any test circuits.

In the described embodiment, all the general units 20 are identical.

In other embodiments, the general units 20 are different, for example some comprise a test unit and some do not comprise any test unit.

Returning to FIG. 2, the interface device further comprises a means for measuring the current disposed in series with groups of battery cells.

In the described embodiment, a measurement shunt or resistor of low value 4 is disposed in each column of battery cells 3.

The general unit 20 comprises means for measuring the voltage at the terminals of the measurement shunt 4. Thus, it is possible to know whether the current for charging and discharging I in the column of cells 3, that is to say passing through the groups of battery cells 2, exceeds a maximum value.

For this, the general unit 20 comprises comparison means (not shown) for comparing the voltage at the terminals of the measurement shunt at a first threshold voltage value representing a maximum charging current or charging threshold, and a second threshold voltage value representing the maximum discharging current or discharging threshold.

When the charging or discharging current I exceeds respectively the charging threshold or the discharging threshold, the general unit 20 signals the presence of a fault in the group of battery cells 2 of the column of cells 3.

The interface device 1000 further comprises an elimination device 5 for a column 3. An elimination device 5 is connected in series with the groups of battery cells 2 of each column.

This column elimination device 5 is provided to disconnect a column from the rest of the columns of the battery module. For example, this elimination device is a fuse.

The device for elimination of a column 5 is actuated by the general unit 2.

The general unit 20 thus comprises means for generating a command A provided for the activation of the device for elimination of a column 5 when an anomaly is detected concerning the group of battery cells of the column 3, such as a voltage of a group of cells 2 outside an authorized range, a temperature outside an authorized range or too high a charging or discharging current.

By virtue of the presence of the devices for elimination of a column 5 from the columns of the battery module 1, the battery module 1 does not require maintenance and remains available even though it loses part of its capacity.

It will be noted that the number of columns able to be eliminated during the estimated life of the battery module must be taken into account in the dimensioning of the battery module in order to ensure a minimum desired capacity for the whole life of the battery module.

By virtue of the structure of the interface device performing the operations locally, the transmission of a high number of signals of the general unit 20 is avoided, and the cabling of such an interface device 1000 is thus simple and lessened. Furthermore, the noise between the lines transporting the signals between the local units 10 and the general unit 20 is avoided.

The invention claimed is:

1. A battery interface device comprising:
   at least one set of local units with each of the local units configured to be associated with a group of battery cells; and
   at least one general unit connected to the local units and configured to connect with a battery management system,
   each of the local units including a first comparison module configured to compare a battery parameter relative to the group of battery cells, the battery parameter associated with a first setpoint value provided by the at least one general unit, each of the local units configured to generate an output signal representing a result of a comparison of the battery parameter and the first setpoint value, and
   the at least one general unit configured to receive the first setpoint value and having an electronic module with an operating parameter representing a general value that depends on the output signals provided by the local units of the at least one set, the general value representing a first number or a second number of the comparisons, the first number indicating that the battery parameter relative to the group of cells is greater than the first setpoint value, the second number indicating that the battery parameter relative to the group of cells is less than the first setpoint value, the electronic module of the general unit including an oscillator circuit with the operating parameter being a period of oscillation of the oscillator circuit, each of the local units of the at least one set being connected to the oscillator circuit by an output capacitor such that the output capacitor is connected in parallel with an oscillator capacitor of the oscillator circuit or is disconnected from the oscillator capacitor according to the output signal.

2. The battery interface device of claim 1, wherein the general unit is configured to send the general value to the battery management system.

3. The battery interface device of claim 2, further comprising a test unit configured to compare a setpoint signal representing the first setpoint value with a reference value.

4. The battery interface device of claim 2, wherein each of the local units further comprises a second comparison module configured to compare one of the battery parameter or another battery parameter relative to the group of battery cells with a second setpoint value provided by the at least one general unit, and, according to a result of comparing the one of the battery parameter or another battery parameter with the second setpoint value, to generate a local command acting on the local unit.

5. The battery interface device of claim 2, wherein the battery parameter relative to the group of battery cells is a voltage or a temperature and the first setpoint value is a value of voltage or of temperature.

6. The battery interface device of claim 1, wherein the at least one general unit comprises:
a test unit configured to compare a setpoint signal representing the first setpoint value with a reference value.

7. The battery interface device of claim 6, wherein each of the local units further comprises a second comparison module configured to compare one of the battery parameter or another battery parameter relative to the group of battery cells with a second setpoint value provided by the at least one general unit, and, according to a result of comparing the one of the battery parameter or another battery parameter with the second setpoint value, to generate a local command acting on the local unit.

8. The battery interface device of claim 1, wherein each of the local units further comprises a second comparison module configured to compare at least one parameter relative to the group of battery cells with a second setpoint value, the second setpoint value provided by the at least one general unit.

9. The battery interface device of claim 8, wherein the local command comprises a second output signal representing the result of the comparison, wherein a charging resistance is connected or disconnected to the output signal of at least one of the local units according to the second output signal.

10. The battery interface device of claim 9, wherein the local units are configured to generate a first output signal according to a result of comparing the battery parameter relative to the group of battery cells with the second setpoint generated by the second comparison module.

11. The battery interface device of claim 8, wherein each of the local units is configured to generate the output signal according to the result of the comparison of the battery parameter relative to the group of battery cells with the value of the second setpoint generated by the second comparison module.

12. The battery interface device of claim 1, wherein the battery parameter relative to the group of battery cells and the first setpoint value includes voltages or temperatures.

13. The battery interface device of claim 1, wherein each of the local units is configured to compare at least one additional parameter relative to the group of cells with at least one additional setpoint value.

14. The battery interface device according of claim 1, wherein each of the local units comprises a first comparison module having a first input configured to receive the battery parameter relative to the group of battery cells and a second input configured to receive a setpoint signal representing the first setpoint value and to generate an output signal, and comprising a switch configured to connect or disconnect the output from the local unit to the at least one general unit, the switch configured to be controlled by the output signal.

15. The battery interface device of claim 14, wherein the at least one general unit is configured to generate the setpoint signal representing the first setpoint value as a square-wave signal of amplitude representing the first setpoint value, each of the local units connected to the at least one general unit by a coupling capacitor.

16. The battery interface device of claim 15, wherein each of the local units further comprises a second comparison module having a first input configured to receive the battery parameter relative to the group of battery cells and a second input configured to receive a second setpoint signal representing the value of the second setpoint and generating an output signal, and comprising a switch configured to connect or disconnect a charging resistance to the output of the local unit based on the output signal.

17. The battery interface device of claim 16, wherein the at least one general unit is configured to generate the setpoint signal representing the value of the second setpoint, the setpoint signal being a square-wave signal of amplitude representing the value of the second setpoint.

18. A battery management system comprising an interface device in accordance with claim 1.

19. A battery module comprising at least one column of the battery cells comprising several of the groups of battery cells connected together, each of the groups of battery cells comprising several of the battery cells connected together in parallel, and further comprising a battery interface device in accordance with claim 1.

20. A set comprising groups of battery cells and a battery management system, the groups of battery cells forming at least one column of the battery cells, the groups of battery cells connected together in series, each of the groups of battery cells comprising several of the battery cells connected together in parallel, the set comprising a battery interface device in accordance with claim 1 disposed between the battery management system and the groups of battery cells.

* * * * *